United States Patent [19]

Spraggins et al.

[11] Patent Number: 5,466,484

[45] Date of Patent: Nov. 14, 1995

[54] RESISTOR STRUCTURE AND METHOD OF SETTING A RESISTANCE VALUE

[75] Inventors: Gary L. Spraggins, Tempe; Martin J. Abresch, Mesa; William B. Newton, Phoenix; Renwin J. Yee, Chandler, all of Ariz.

[73] Assignee: Motorola, Inc., Schaumburg, Ill.

[21] Appl. No.: 128,282

[22] Filed: Sep. 29, 1993

[51] Int. Cl.$^6$ .............. H01L 21/465; H01L 27/02; G01K 7/00; H01C 10/00
[52] U.S. Cl. .............. 437/228; 437/248; 437/918; 437/171; 437/174; 257/529; 257/536; 257/538; 374/178; 338/195
[58] Field of Search .................... 257/529, 536, 257/538; 374/178; 437/908, 228, 248, 918; 338/195, 171, 174

[56] References Cited

U.S. PATENT DOCUMENTS 4,356,379  10/1982  Graeme .................... 257/529
4,808,009  2/1989   Sittler et al. .............. 257/529
5,233,327  8/1993   Bartush et al. .

Primary Examiner—Edward Wojciechowicz
Attorney, Agent, or Firm—Rennie William Dover

[57] ABSTRACT

A resistor structure (10) having a heating element (35) and a resistor (32), and a method of trimming the resistor (32). The heating element (35) is separated from the resistor (32) by a layer of dielectric material (19). The resistor (32) has a layer of resistive material (23) on an etch control layer (22). The resistor (32) is trimmed by providing current pulses (62) through the heating element (35). Heat generated by the current pulses flows to the resistor (32) and anneals or trims the resistor (32). A resistor trimming variable, e.g. a voltage across resistor contacts (30, 31), is monitored and the current pulses are modulated in accordance with the value of the resistor trimming variable (63). The trimming step is terminated when the desired resistance value of the resistor (32) is attained.

17 Claims, 3 Drawing Sheets

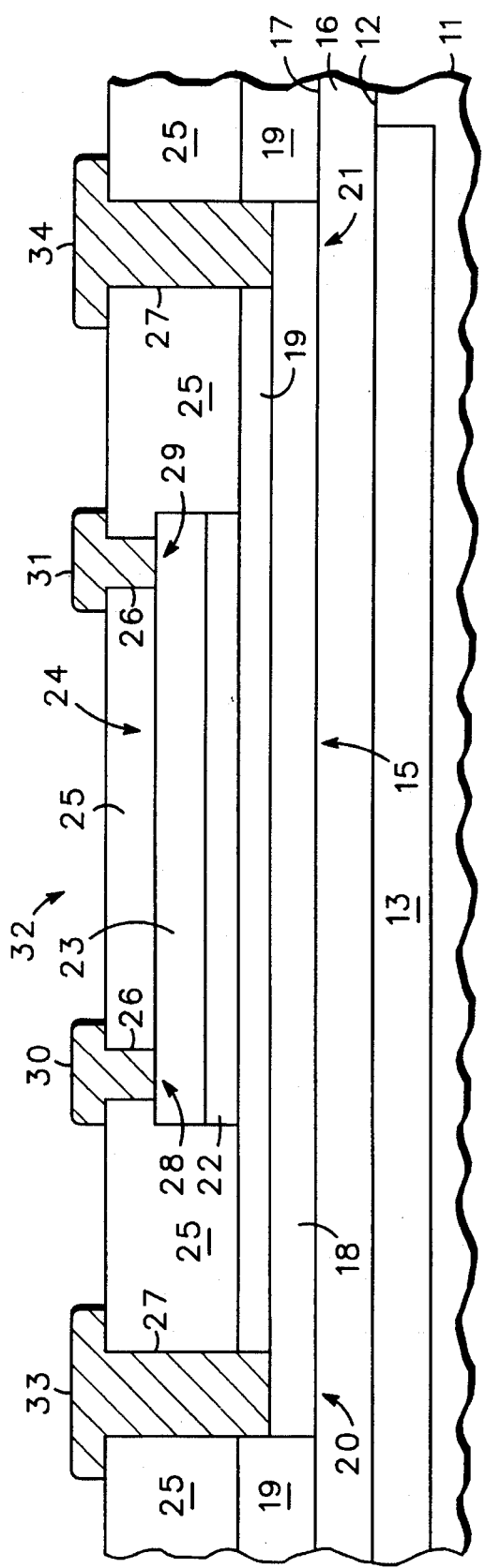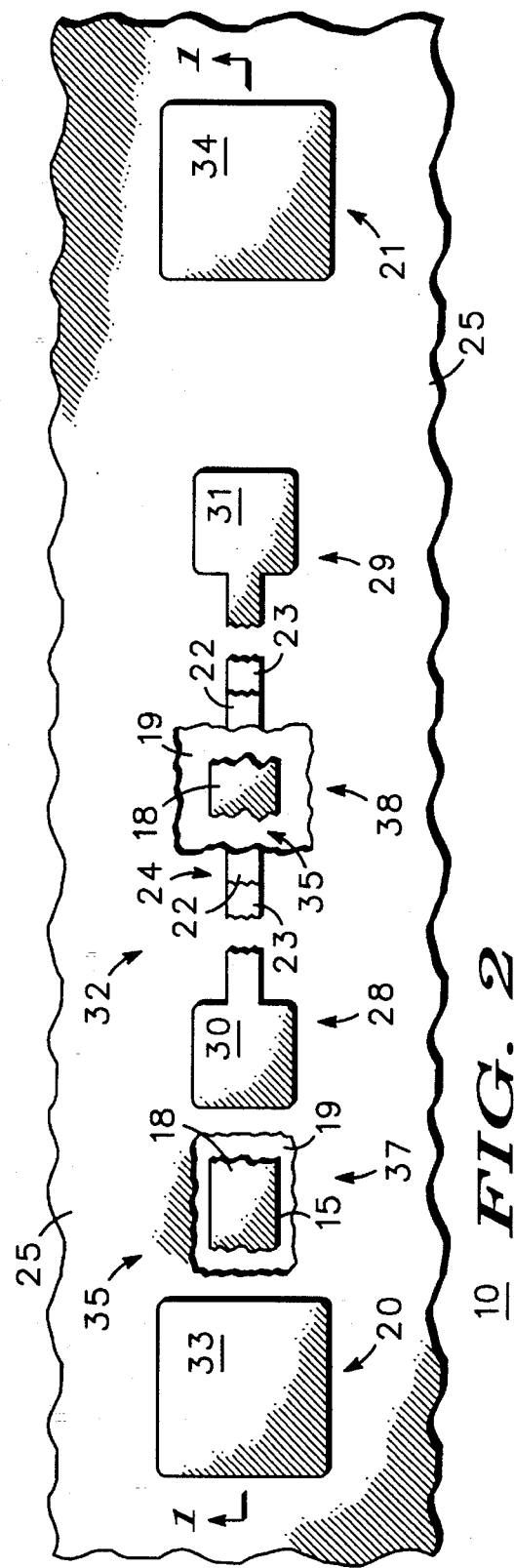

40

50

5,466,484

RESISTOR STRUCTURE AND METHOD OF SETTING A RESISTANCE VALUE

BACKGROUND OF THE INVENTION

This invention relates, in general, to adjusting electrical components and, more particularly, to passive circuit components and methods of adjusting their values.

Quite often, manufacturers of integrated circuits must adjust or tailor the electrical characteristics of semiconductor devices in order to achieve optimal integrated circuit quiescent operating conditions. For example, adjusting component values on the integrated circuit chip is a method that can be used to minimize the input offset voltage of an operational amplifier or to adjust the offset of a pressure sensor. Adjusting the voltage or pressure references can set the quiescent output voltage of an operational amplifier or a pressure sensor to precise values.

Typically, electrical parameters of integrated circuits are adjusted by the trimming of resistors. The term "trimming" is used to mean the fine adjustment of resistors, capacitors, or inductors in a circuit. Methods for "trimming" electronic components such as transistors include mechanical, electrical, and chemical. These methods and their drawbacks are described in U.S. Pat. No. 4,606,781, issued to Robert L. Vyne on Aug. 19, 1986.

Vyne improves on the drawbacks of the prior art by using metal migration in a zipper trimming process. Briefly, Vyne teaches setting a resistance value by applying a current to a resistor for a predetermined time. The current causes the metal in a metal contact region at one end of the resistor to migrate to a metal contact region at the opposite end of the resistor, thereby trimming the resistor.

Accordingly, it would be advantageous to have a resistor structure comprising a resistor, and a method of setting a resistance value of the resistor, i.e., trimming the resistor. The resistor structure and the method should permit trimming the resistor to a wide range of resistance values. It is desirable that the physical mechanism limiting the resistor value not be breakdown of a PN junction, physical dimensions of the resistor, or the resistor material. Further, the method should allow adjusting an on-chip resistor after the integrated circuit has been packaged.

SUMMARY OF THE INVENTION

Briefly stated, the present invention is a method of setting a resistance value of a resistor. The method comprises the steps of providing a substrate having a major surface, forming a heating element on the major surface, forming an isolation layer over the heating element, forming the resistor on the isolation layer, wherein a portion of the isolation layer is sandwiched between the resistor and the heating element, and annealing the resistor.

Another aspect of the present invention is a resistor structure comprising a heating element. An isolation material is disposed on the heating element, and a resistor is disposed on the isolation material.

BRIEF DESCRIPTION OF THE DRAWINGS

FIG. 1 illustrates a highly enlarged cross-sectional view along section line 1—1 of FIG. 2 in accordance with a first embodiment of the present invention;

FIG. 2 illustrates a partially cut-away plan view of a resistor structure in accordance with the first embodiment of the present invention;

DETAILED DESCRIPTION OF THE DRAWINGS

Figure 3:
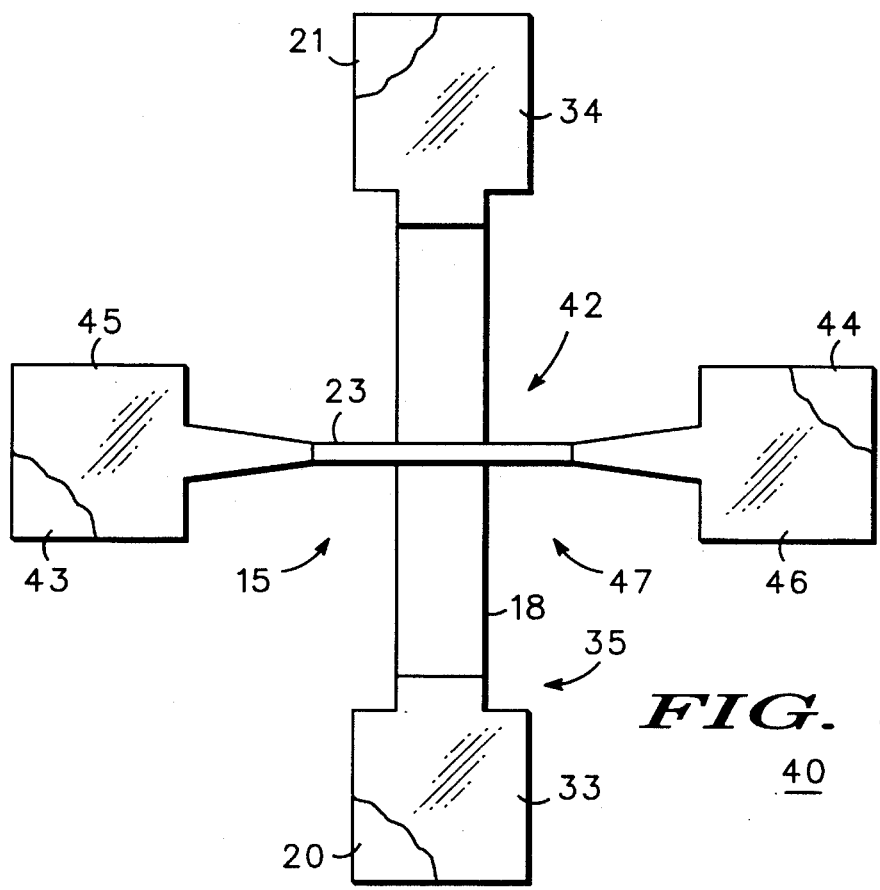
FIG. 3 illustrates a partially cut-away plan view of a portion of a resistor structure in accordance with a second embodiment of the present invention.

FIG. 1 illustrates a highly enlarged cross-sectional view of a resistor structure 10, along section line 1—1 of FIG. 2, in accordance with a first embodiment of the present invention. The resistor structure 10 comprises a support substrate 11 having a major surface 12. Preferably, the support substrate 11 is a semiconductor material in which semiconductor devices such as sensors, operational amplifiers, D/A converters, A/D converters, and the like are fabricated. By way of example, the support substrate 11 is silicon which has an integrated circuit 13 such as a pressure sensor formed therein.

A layer of insulating material 16 is formed on the major surface 12, wherein the layer of insulating material 16 serves as an insulating substrate. Suitable materials for the insulating substrate 16 include oxides, nitrides, polyimide, spin-on glasses, and the like. A heating layer 18 is formed on a major surface 17 of the insulating substrate 16, wherein the heating layer 18 is a conductive material that serves as a conductive layer. By way of example, heating layer 18 is an electrically conductive material. In the first embodiment, the layer of insulating material 16 is both an electrical and a thermal barrier between the support substrate 11 and a heating layer 18. In other words, the heating layer 18 is separated from the support substrate 11 by the insulating material 16. Suitable materials for the heating layer 18 include silicon, germanium, gallium arsenide, tungsten, titanium tungsten, chrome, and the like. The resistivity of the heating layer 18 is set using techniques well known to those skilled in the art. For example, when the heating layer 18 is a semiconductor material, the resistivity is set by doping the heating layer 18. By way of example, the surface concentration of the dopant of the heating layer 18 ranges between approximately $10^{14}$ atoms/cm$^3$ to approximately $10^{21}$ atoms/cm$^3$.

In accordance with the first embodiment, the heating layer 18 is patterned to have two square shaped heater contact regions 20 and 21 connected by a rectangular shaped central region 15. More particularly, in the first embodiment the heating layer 18 has a dumbbell shape, wherein the dumbbell has a central region 15 and two square-shaped contact regions 20 and 21. As those skilled in the art are aware, the resistivity of the heating layer 18 may be set either before or after it is patterned. Thus, the order of the process steps for setting the resistivity of the heating layer 18 is not a limitation of the present invention. Techniques for forming the insulating substrate 16, the heating layer 18, as well as doping and patterning the heating layer 18 are well known to those skilled in the art. Further, it shall be understood that the shape of the heating layer 18 is not a limitation of the present invention, and that suitable shapes for heating layer 18 include circular, spiral, octagonal, etc.

A layer of dielectric material 19 is formed on the patterned heating layer 18, and on the exposed portions of the major surface 17. The layer of dielectric material 19 serves as an isolation layer. Suitable materials for the layer of dielectric material 19 include silicon dioxide, silicon nitride, polyimide, and the like. An etch control layer 22 is formed on the layer of dielectric material 19. Preferably, the material for the etch control layer 22 has the same etch selectivity as the material for the layer of resistive material 23. By way of example, the material for the etch control layer 22 is a semiconductor material such as intrinsic polysilicon. The etch control layer 22 is electrically isolated from the patterned layer of conductive material 18 by the layer of dielectric material 19.

A layer of resistive material 23 is formed on the etch control layer 22. Suitable materials for the layer of resistive material 23 include metals or metal silicides such as, for example, tungsten silicide, chromium silicide, and the like. In accordance with the example in which intrinsic polysilicon serves as the material for the etch control layer 22, the layer of resistive material is tungsten silicide. The etch rates of tungsten silicide and intrinsic polysilicon are approximately equal in standard dry etch systems. In other words, the etch selectivity ratio of tungsten silicide to intrinsic polysilicon is approximately 1:1. In the present example, the etch control layer 22 and the layer of resistive material 23 cooperate to form a conductive material having a resistivity. Further, polysilicon is a suitable material for the etch control layer 22 when chromium silicide is the material for the layer of resistive material 23. Thus, the conductive material includes a combination of a metal and a semiconductor material.

The layer of resistive material 23 and the etch control layer 22 are patterned such that a portion of the layers 22 and 23 are over a portion of the patterned heating layer 18. By way of example, the layers 22 and 23 are patterned to have a similar shape as the patterned heating layer 18, i.e., a dumbbell shape having a central region 24 and two square shaped resistor contact regions 28 and 29. The rectangular shaped central region 24 of the patterned layers 22 and 23 is parallel to the rectangular shaped central region 15 of the patterned heating layer 18. In the first embodiment illustrated in FIGS. 1 and 2, the width of the rectangular shaped central region 24 of the patterned layers 22 and 23 is less than the width of the rectangular shaped central region 15 of the patterned heating layer 18. Accordingly, the entire rectangular shaped central region 24 of the patterned layers 22 and 23 is over the rectangular shaped central region 15.

A third layer of dielectric material 25 is formed on the layer of resistive material 23 and an exposed portion of the layer of dielectric material 19. A first set of vias 26 are formed in the third layer of dielectric material 25, wherein the first set of vias 26 expose portions of contact regions 28 and 29 of the patterned layer of resistive material 23. A second set of vias 27 is formed in the second and third layers of dielectric material 19 and 25, respectively, wherein the second set of vias expose portions of the heater contact regions 20 and 21 of the patterned heating layer 18.

Electrical contacts are formed by filling the first and second sets of vias 26 and 27, respectively, with an electrically conductive material. More particularly, a first electrode 30 is formed in a first via of the first set of vias 26 and contacts the first resistor contact region 28, and a second electrode 31 is formed in a second via of the first set of vias 26 and contacts the second resistor contact region 29. Electrical contacts or electrodes 30 and 31 and portions of the etch control layer 22 and the layer of resistive material 23 form a resistor 32. In other words, the etch control layer 22 and the layer of resistive material 23 cooperate to form the resistor 32.

Further, a third electrical contact or electrode 33 is formed in a first of the second set of vias 27 and contacts the first heater contact region 20 and a fourth electrical contact or electrode 34 is formed in a second of the second set of vias 27 and contacts the second heater contact region 21. The third and fourth electrical contacts 33 and 34, respectively, and the patterned heating layer 18 form a heating element 35. The material for the electrical contacts 30, 31, 33, and 34 may be, for example, aluminum, gold, copper, and the like. Methods of patterning layers such as etch control layer 22 and layer of resistive material 23, as well as methods of forming electrical contacts are well known to those skilled in the art. It shall be understood that the same reference numerals are used in the figures to denote the same elements.

FIG. 2 illustrates a partially cut-away plan view of the resistor structure 10 which comprises a heating element 35 and a resistor 32. More particularly, a first partially cut-away section 37 shows a portion of the heating layer 18 and the second partially cut-away section 38 shows the spatial relationship between the heating layer 18 and the layer of resistive material 23. The heating element 35 comprises the heating layer 18 which has a rectangular shaped central region 15 that extends from the first contact 33 to the second contact 34. The second layer of dielectric material 19 covers the heating layer 18.

In the embodiment shown in FIG. 2, the resistor 32 is between the third and fourth contacts 33 and 34, respectively. Similar to the heating layer 18, the etch control layer 22 and the layer of resistive material 23 have rectangular shaped central regions that extend from the first contact 30 to the second contact 31. Further, the second partially cut-away section 38 shows that the etch control layer 22 of the resistor 32 is separated from the heating layer 18 of the heating element 35 by the second layer of dielectric material 19, i.e., a portion of the isolation layer 19 is sandwiched between the resistor 32 and the heating element 35. In the first embodiment, the width of the rectangular shaped central region 24 of the resistor 32 is less than the width of the rectangular shaped central region 15 of heating element 35.

FIG. 3 illustrates a partially cut-away plan view of a resistor structure 40 in accordance with a second embodiment of the present invention. The resistor structure 40 includes a heating or annealing element 35 comprising the patterned heating layer 18, the second layer of dielectric material 19 (not shown), the etch control layer 22 (not shown), and the layer of resistive material 23. It shall be understood that the second and third layers of dielectric material 19 and 25, respectively, have been omitted from the partially cut-away plan view of FIG. 3 to more clearly illustrate the second embodiment of the present invention. It shall be further understood that the etch control layer 22 is present in the second embodiment, however it is not visible in the partially cut-away plan view because it is below the layer of resistive material 23 and has the same pattern as the layer of resistive material 23. Patterned heating layer 18 and the second layer of dielectric material 19 (not shown) are the same as illustrated and discussed with reference to FIGS. 1 and 2.

The etch control layer 22 and the layer of resistive material 23 are patterned to have a rectangular shaped central region 42 with a square shaped contact region 43 at one end and a square shaped contact region 44 at the other end (similar to the patterned layers 22 and 23 illustrated in FIG. 2). However, the rectangular shaped central region 42 is perpendicular to the central region 15 of the patterned heating layer 18. A portion of the patterned layers 22 and 23 cross over the rectangular shaped central region 15 of the patterned heating layer 18 and are separated from patterned heating layer 18 by the second layer of dielectric material 19 (not shown).

Electrical contacts 45 and 46 are formed on the square shaped contact regions 43 and 44, respectively, and are shown as being partially cut-away to illustrate a portion of the contact regions 43 and 44. As those skilled in the art will understand, electrical contacts 45 and 46 extend through vias (not shown) in the third layer of dielectric material 25. In addition, electrical contacts 33 and 34 are formed on square shaped contact regions 20 and 21, respectively, wherein the electrical contacts 33 and 34 extend through the second set of vias 27 (FIG. 1). Electrical contacts 33 and 34 are shown as being partially cut-away to illustrate a portion of the contact regions 20 and 21, respectively. Electrical contacts 45 and 46 in conjunction with the patterned layers 22 and 23 form a resistor 47 and electrical contacts 33 and 34 together with the patterned heating layer 18 form the heating element 35. Thus, the resistor 47 and the heating element 35 cooperate to form the resistor structure 40.

Figure 4:
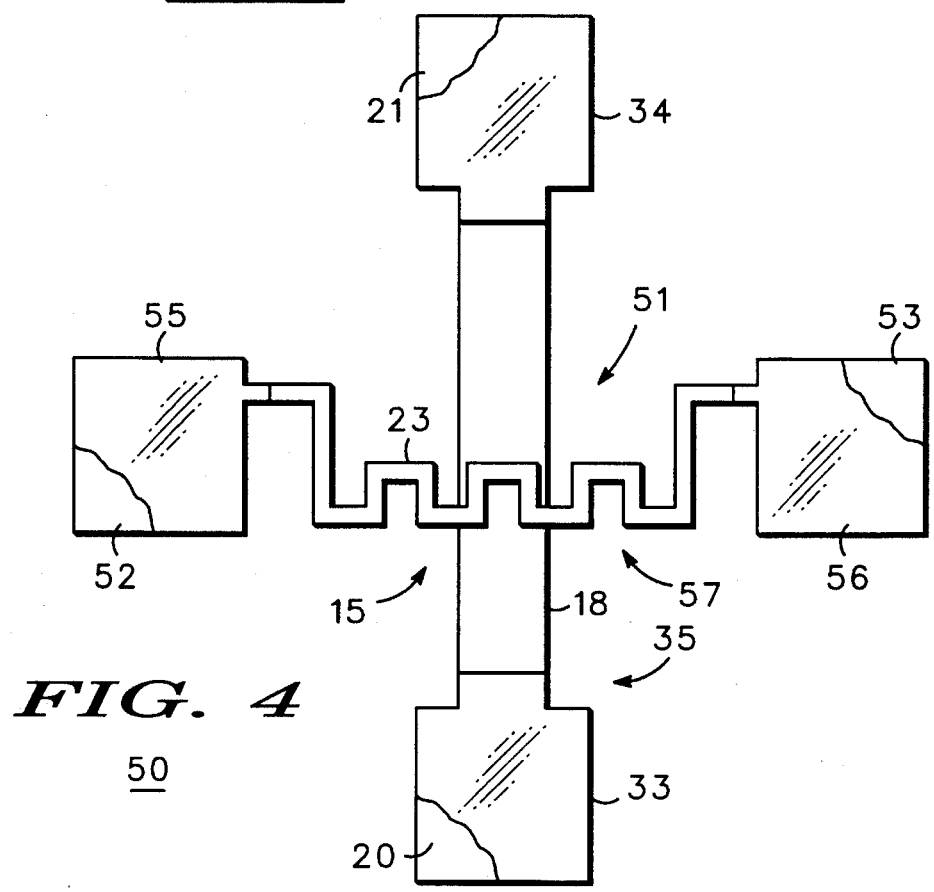
FIG. 4 illustrates a partially cut-away plan view of a portion of a resistor structure in accordance with a third embodiment of the present invention.

FIG. 4 illustrates a partially cut-away plan view of a resistor structure 50 in accordance with a third embodiment of the present invention. The resistor structure 50 includes a heating element 35 comprising the patterned heating layer 18, and a resistor 57 comprising the etch control layer 22 (not shown), and the layer of resistive material 23. The second and third layers of dielectric material 19 and 25, respectively, have been omitted from the partially cut-away plan view of FIG. 4 to more clearly illustrate the third embodiment of the present invention. It shall be further understood that the etch control layer 22 is present in the third embodiment, however it is not visible in the partially cut-away plan view of FIG. 4 because it is below the layer of resistive material 23 and has the same pattern as the layer of resistive material 23. Patterned heating layer 18 and the second layer of dielectric material 19 (not shown) are the same as illustrated and discussed with reference to FIGS. 1, 2, and 3.

The etch control layer 22 and the layer of resistive material 23 are patterned to have a central region 51 in the shape of a square wave and two square shaped contact regions 52 and 53. A section of the square wave shaped central portion 51 crosses over the patterned heating layer 18, wherein the square wave shaped central region 51 is separated from the patterned heating layer 18 by the second layer of dielectric material 19 (not shown).

Electrical contacts 55 and 56 are formed on square shaped contact regions 52 and 53, respectively, and are shown as being partially cut-away to illustrate a portion of the contact regions 52 and 53. As those skilled in the art will understand, electrical contacts 55 and 56 extend through vias (not shown) in the third layer of dielectric material 25. In addition, electrical contacts 33 and 34 are formed on square shaped contact regions 20 and 21, respectively, wherein the electrical contacts 33 and 34 extend through the second set of vias 27 (FIG. 1). Electrical contacts 33 and 34 are shown as being partially cut-away to illustrate a portion of the contact regions 20 and 21, respectively. Electrical contacts 55 and 56 in conjunction with the patterned layers 22 and 23 form a resistor 57, and electrical contacts 33 and 34 together with the patterned heating layer 18 form the heating element 35. Thus, the resistor 57 and the heating element 35 cooperate to form the resistor structure 50.

Figure 5:
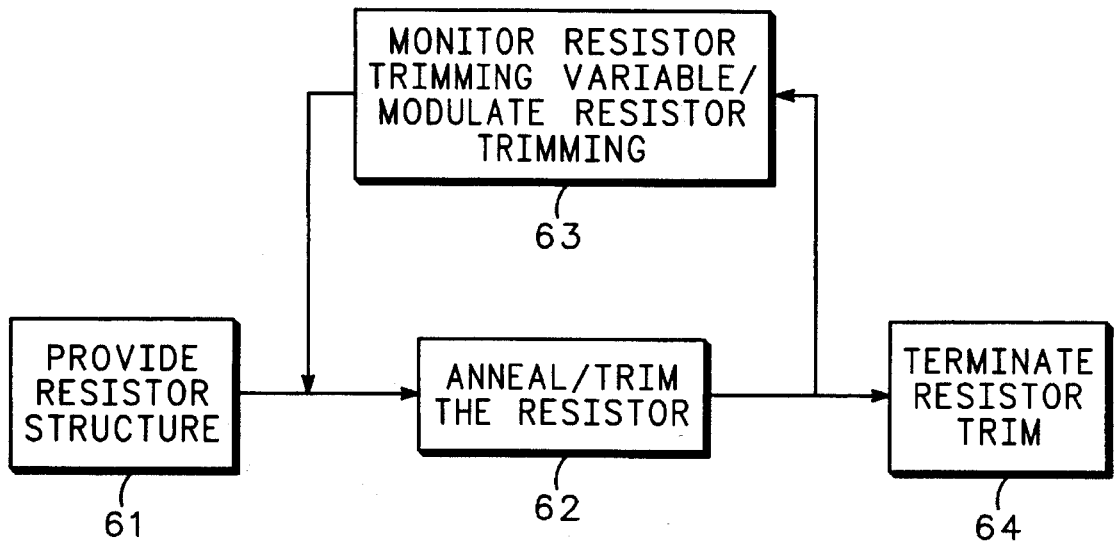
FIG. 5 illustrates a flow diagram of a method of trimming a resistor in accordance with the present invention.

FIG. 5 illustrates a flow diagram 60 of the method for setting a resistance value of a resistor in accordance with the present invention. In the method of the present invention, the patterned etch control layer 22 and the patterned layer of resistive material 23 (FIGS. 1–4) are thermally annealed to set a resistance value of the resistors 32, 47, and 57. In other words, annealing the etch control layer 22 and the layer of resistive material 23 changes a resistive value of the material of the etch control layer 22 and the layer of resistive material 23. The heat for annealing the resistors 32, 47, and 57 is dissipated from the heating element 35. To simplify the description, resistor structures 10, 40, and 50, and their respective resistors 32, 47, and 57 will be referred to as resistor structure 10 having a resistor 32. In other words, reference to resistor structure 10 and resistor 32 shall be taken to mean any of the resistor structures 10, 40, 50, and their respective resistors 32, 47, and 57, and other embodiments encompassed by the broad scope of the claims.

In a first step 61, the resistor structure 10 is provided. The particular resistor structure provided is in accordance with the desired final resistance value of the resistor. For example, a larger gross resistance value is obtained from the resistor 57 of the resistor structure 50 than the resistor 32 of the resistor structure 10. In other words, the etch control layer 22 and the layer of resistive material 23 are patterned to provide resistors having gross or coarse resistance values. Subsequently, the resistors 32, 47, and 57 are trimmed to a desired value using the method of the present invention.

The resistor 32 is trimmed by pulsing a current through the heating element 35 as indicated by step 62 of the flow diagram 60. The flow of current through the heating element 35 results in the dissipation of power in the form of heat. The heat flows from the heating element 35 to the resistor 32 and anneals the resistor material, i.e., the patterned etch control layer 22 and the patterned layer of resistive material 23. In other words, the resistance value of the layers 22 and 23 is adjusted by applying a current through the heating element 35, which generates heat that anneals or adjusts the resistivity of the resistor 32, i.e., layers 22 and 23.

Figure 6:
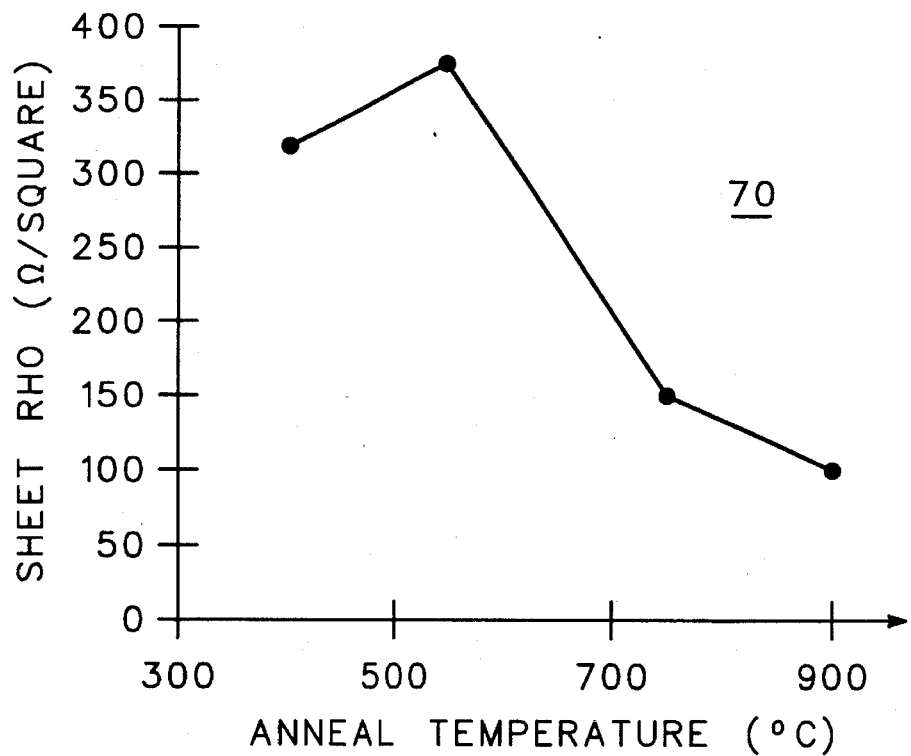
FIG. 6 illustrates a plot of resistivity versus anneal temperature.

An annealing curve 70 (shown in FIG. 6) illustrates the relationship between the annealing temperature and the sheet resistance of tungsten silicide. For a tungsten silicide resistor, the annealing curve 70 indicates that it is preferable for the resistor 32 be annealed at temperatures of at least 400° C. Thus, the heating element 35 should be capable of producing temperatures of at least 400° C. The heat dissipated by the heating element 35 changes the crystal structure of the tungsten silicide from a hexagonal structure to a tetragonal structure thereby increasing the conductivity of the tungsten silicide i.e., decreasing the resistivity of the tungsten silicide resistor.

In conjunction with the pulsing of a current through the heating element 35, a resistor trimming variable is monitored as indicated by element 63. The resistor trimming variable provides an indication of the value of the resistor 32 and may be a measurement of the resistance value of the resistor 32, a voltage value between a first contact 30 and a second contact 31 of the resistor 32, a measure of the heat generated by the heating element 35, a measure of the temperature arriving at the resistor 32, a combination thereof, and the like. Other suitable resistor trimming variables include an output voltage of an integrated device, an offset voltage of an operational amplifier, a sensitivity of a pressure sensor (i.e., the ratio of the change in output voltage to the change in pressure), etc. The current pulses are modulated in accordance with the value of the resistor trimming variable. When the resistor trimming variable attains a desired value, the resistor trimming process is ended by terminating the current pulses through the heating element 35, and thus preventing the heating element 35 from generating heat as indicated by reference numeral 64.

The steps of pulsing a current through the heating element 62, monitoring the resistor trimming variable and modulating the resistor trimming 63 (e.g. modulating the current pulses), and terminating the resistor trimming 64 may be performed manually or with the aid of a microprocessor. The use of a microprocessor provides the advantages of speed and very precise trimming control. For example, the microprocessor can be programmed to provide current pulses having large current pulse widths when a difference between the value of the resistance trimming variable and the desired resistance value of the resistor 32 exceed a first preselected value. When the difference is less than or equal to the first preselected value, the microprocessor determines a second preselected value and changes the current pulse widths to allow for a finer adjustment of the resistance value. In other words, the microprocessor changes the pulse widths to slow down the trimming of the resistor 32, permitting precise control of the resistance value. When the difference between the value of the resistance trimming variable and the desired resistance value of the resistor 32 becomes approximately equal to or less than the second preselected value, the microprocessor determines a third preselected value and changes the current pulse width and amplitude to allow for an even finer adjustment of the resistance value. This iterative process continues until the resistance trimming value is within a desirable limit.

By now it should be appreciated that a resistor structure and a method for trimming a resistor have been provided. The resistor structure includes a heating element and a resistor, wherein the heating element is spaced apart and electrically isolated from the resistor. The resistor comprises a patterned etch control layer and a patterned layer of resistive material. The patterned layers provide the resistor with a coarse value.

The resistor is trimmed by thermal annealing. The range through which the resistor may be trimmed is controlled by the area of the portion of the resistor that is annealed. In other words, the resistor is trimmable through a larger range of resistance values by increasing the percentage of the area of the resistor over the heating element. Thus, the resistor is patterned to have a predetermined percentage of the first conductive material in a spacial relationship with the second conductive material, wherein the spatial relationship is shown as the resistor being over the heating element in FIGS. 1–4. However, it shall be understood that the spacial relationship may be taken to mean that the resistor is under, beside, or otherwise adjacent the heating element.

Current pulses are sent through the heating element resulting in the generation of heat that travels to and anneals the resistor. In other words, a current applied through the heating element heats the resistor thereby adjusting the resistance value of the layer of resistive material and the etch control layer, and thus the resistivity of the resistor. The current pulses are modulated, in accordance with a feedback loop, to generate more or less heat, depending on the desired value of the resistor.

Other modifications and variations will be apparent to those skilled in the art. For example, different patterns for the heating layer, the etch control layer, and the layer of resistive material may be used to provide different resistor values. It is intended to encompass all such variations and modifications within the broad scope of the invention.

We claim:

1. A method for setting a resistance value of a resistor, comprising the steps of:

providing a substrate having a major surface;

forming a heating element on the major surface;

forming an isolation layer over the heating element;

forming the resistor on the isolation layer, wherein a portion of the isolation layer is sandwiched between the resistor and the heating element;

providing a current which flows through the heating element, wherein heat is generated in response to the current flowing through the heating element; and annealing the resistor to set the resistance value of the resistor using the heat generated by the current flowing through the heating element, wherein the resistance value of the resistor remains set after removal of the heat.

2. A method of setting a resistance value of a resistor as claimed in claim 1, wherein the step of forming a heating element includes providing a semiconductor material on the major surface and doping a portion of the semiconductor material to form the heating element.

3. A method of setting a resistance value of a resistor as claimed in claim 1, wherein the step of forming an isolation layer further comprises:

forming a layer of dielectric material on the heating element; and forming a layer of semiconductor material on the layer of dielectric material.

4. A method of setting a resistance value of a resistor as claimed in claim 1, wherein the step of annealing the resistor comprises applying a current pulse through the heating element.

5. A method of setting a resistance value of a resistor as claimed in claim 4, wherein applying a current pulse comprises the steps of:

sending at least one current pulse through the heating element; and monitoring a voltage value between a first contact and a second contact of the resistor.

6. A method of setting a resistance value of a resistor as claimed in claim 1, further including forming a first electrode which contacts a portion of the resistor and forming a second electrode which contacts a portion of the heating element.

7. A method for adjusting a resistance value of a resistor, comprising the steps of:

providing a conductive layer;

forming a layer of insulating material on the conductive layer;

forming an etch control layer on the layer of insulating material;

forming a layer of resistive material on the etch control layer, wherein the etch control layer and the layer of resistive material cooperate to form the resistor;

forming an electrical contact to the layer of resistive material;

providing a current which flows through the conductive layer, wherein heat is generated in response to the current flowing through the conductive layer; and annealing at least the layer of resistive material to adjust the resistance value of the resistor using the heat generated by the current flowing through the conductive layer, wherein the resistance value of the resistor remains adjusted after removal of the heat.

8. A method of adjusting a resistance value of a resistor as claimed in claim 7, wherein the step of providing a conductive layer includes doping the conductive layer.

9. A method of adjusting a resistance value of a resistor as claimed in claim 7, wherein the step of providing a conductive layer includes providing the conductive layer on a substrate.

10. A method of adjusting a resistance value of a resistor as, claimed in claim 7, wherein the step of annealing the layer of resistive material changes a resistance value of a portion of the layer of resistive material.

11. A method of adjusting a resistance value of a resistor as claimed in claim 10, wherein the step of annealing the layer of resistive material includes applying a current pulse through the conductive layer.

12. A method of adjusting a resistance value of a resistor as claimed in claim 7, wherein the step of forming a layer of resistive material includes forming the layer of resistive material from tungsten silicide.

13. A method for setting a resistance value of a resistor, comprising the steps of:

provomng a substrate having a major surface;

forming a first layer of insulation material on the major surface;

forming an annealing element on the first layer of insulation material;

forming a second layer of insulation material on the annealing element;

forming an etch control layer on the second layer of insulation material;

forming a layer of resistive material on the etch control layer;

etching a portion of the etch control layer and the layer of resistive material to form a resistor;

generating a current, wherein the current flows through the annealing element thereby dissipating heat; and using the heat to anneal the resistor, wherein a resistance value of the resistor is set by annealing the resistor and remains set after removal of the heat.

14. The method of claim 13, wherein the step of using the heat to anneal the resistor includes using heat of at least 400° C.

15. The method of claim 13, wherein the step of generating a current includes sending current pulses through the annealing element.

16. The method of claim 13, further including the steps of:

forming a third layer of dielectric material on the layer of resistive material;

forming a first opening in a first portion of the third layer of dielectric material, the first opening exposing a first portion of the layer of resistive material; and forming a second opening in a second portion of the third layer of dielectric material, the second opening exposing a second portion of the layer of resistive material.

17. The method of claim 13, wherein the step of forming a layer of forming an annealing element includes forming a layer of polysilicon on the first layer of dielectric material and doping the layer of polysilicon.

* * * * *